United States Patent
Snoeij et al.

(10) Patent No.: US 11,092,656 B2
(45) Date of Patent: Aug. 17, 2021

(54) FLUXGATE MAGNETIC FIELD DETECTION METHOD AND CIRCUIT

(71) Applicant: Texas Instruments Incorporated

(72) Inventors: Martijn F. Snoeij, Erding (DE); Viola Schäffer, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 169 days.

(21) Appl. No.: 14/975,777

(22) Filed: Dec. 19, 2015

(65) Prior Publication Data
US 2016/0334473 A1 Nov. 17, 2016

Related U.S. Application Data

(60) Provisional application No. 62/160,371, filed on May 12, 2015.

(51) Int. Cl.
*G01R 33/00* (2006.01)
*G01R 33/04* (2006.01)

(52) U.S. Cl.
CPC ......... *G01R 33/0041* (2013.01); *G01R 33/04* (2013.01)

(58) Field of Classification Search
CPC .............................. G01R 33/04–33/05; G01R 33/0023–33/0041; G01N 27/72–27/9093
See application file for complete search history.

(56) References Cited

U.S. PATENT DOCUMENTS

| | | | |
|---|---|---|---|
| 3,571,700 A | 3/1971 | Paine | |
| 4,290,018 A * | 9/1981 | Rhodes | G01R 33/04 324/255 |
| 4,293,815 A | 10/1981 | West et al. | |
| 4,396,885 A * | 8/1983 | Constant | F41G 3/225 324/207.18 |
| 4,646,015 A * | 2/1987 | Phillips | G01R 33/04 324/253 |
| 4,914,381 A | 4/1990 | Narod | |
| 4,929,899 A * | 5/1990 | Weixelman | G01R 33/04 324/253 |

(Continued)

FOREIGN PATENT DOCUMENTS

| | | |
|---|---|---|
| JP | 08005380 A | 1/1996 |
| JP | 3399185 B2 | 4/2003 |
| SU | 832502 A1 | 5/1981 |

OTHER PUBLICATIONS

Search Report for PCT No. PCT/US14/51350, dated Feb. 27, 2015.

(Continued)

*Primary Examiner* — Huy Q Phan
*Assistant Examiner* — David B Frederiksen
(74) *Attorney, Agent, or Firm* — Lawrence J. Bassuk; Charles A. Brill; Frank D. Cimino

(57) ABSTRACT

A circuit and method for magnetic field detection is disclosed. A fluxgate sensor comprises a fluxgate having a first core and a second core. A sense coil has a first winding around the first fluxgate core and a second winding around the second fluxgate core. A fluxgate detection circuit is coupled to the sense coil and outputs a signal proportional to an external magnetic field applied to the fluxgate. A detection circuit is coupled to the first winding and outputs a signal that indicates whether voltage pulses have been detected on the first winding.

15 Claims, 4 Drawing Sheets

(56) References Cited

U.S. PATENT DOCUMENTS

| | | | | |
|---|---|---|---|---|
| 5,689,445 | A | * | 11/1997 | Vogt .................. G01C 17/30 |
| | | | | 701/530 |
| 5,767,672 | A | | 6/1998 | Guichard et al. |
| 6,072,676 | A | | 6/2000 | Tran et al. |
| 6,201,391 | B1 | * | 3/2001 | Burkhardt .............. G01N 27/82 |
| | | | | 324/233 |
| 6,222,363 | B1 | * | 4/2001 | Cripe .................. G01L 3/102 |
| | | | | 324/225 |
| 6,268,725 | B1 | * | 7/2001 | Vernon ................ G01R 33/04 |
| | | | | 324/253 |
| 6,278,272 | B1 | | 8/2001 | Scarzello et al. |
| 6,330,833 | B1 | * | 12/2001 | Opie .................. G01L 3/102 |
| | | | | 73/862.333 |
| 6,350,978 | B1 | * | 2/2002 | Kasai .................. G01J 1/32 |
| | | | | 250/205 |
| 6,429,651 | B1 | * | 8/2002 | Choi .................. G01R 33/04 |
| | | | | 324/225 |
| 6,772,078 | B2 | | 8/2004 | Uehira |
| 6,912,476 | B2 | | 6/2005 | Huber-Lenk et al. |
| 7,034,586 | B2 | | 4/2006 | Mehas et al. |
| 7,038,514 | B2 | | 5/2006 | Leith et al. |
| 7,135,841 | B1 | | 11/2006 | Tomiyoshi et al. |
| 7,196,523 | B1 | * | 3/2007 | Yamada ............. G01R 31/3613 |
| | | | | 324/428 |
| 7,298,141 | B2 | | 11/2007 | Bartington |
| 7,375,940 | B1 | * | 5/2008 | Bertrand .............. H02H 3/337 |
| | | | | 361/46 |
| 7,391,210 | B2 | | 6/2008 | Zhang et al. |
| 7,391,211 | B2 | | 6/2008 | Cripe |
| 7,400,120 | B2 | | 7/2008 | Hashimoto et al. |
| 8,339,133 | B2 | | 12/2012 | Teppan |
| 8,976,549 | B2 | | 3/2015 | genannt Berghegger |
| 9,030,248 | B2 | | 5/2015 | Kim et al. |
| 9,300,212 | B2 | | 3/2016 | Notman et al. |
| 2001/0012988 | A1 | * | 8/2001 | Motz .................. G01D 3/024 |
| | | | | 702/189 |
| 2002/0097042 | A1 | * | 7/2002 | Kawate ................ G01B 7/003 |
| | | | | 324/207.17 |
| 2002/0180434 | A1 | * | 12/2002 | How .................. G01R 33/04 |
| | | | | 324/254 |
| 2003/0173922 | A1 | | 9/2003 | Pelonis |
| 2003/0178993 | A1 | * | 9/2003 | Tang .................. G01R 33/04 |
| | | | | 324/253 |
| 2003/0197554 | A1 | | 10/2003 | Sim |
| 2004/0040391 | A1 | | 3/2004 | May |
| 2004/0124836 | A1 | * | 7/2004 | Kang ................ G01R 33/045 |
| | | | | 324/253 |
| 2004/0196035 | A1 | * | 10/2004 | Leger ................ G01R 33/045 |
| | | | | 324/253 |
| 2005/0024050 | A1 | * | 2/2005 | Na .................. G01R 33/05 |
| | | | | 324/253 |
| 2006/0033481 | A1 | | 2/2006 | Thiele et al. |
| 2007/0103152 | A1 | * | 5/2007 | Cripe ................ G01R 33/04 |
| | | | | 324/253 |
| 2007/0150224 | A1 | * | 6/2007 | Rivoir .............. G01R 31/31703 |
| | | | | 702/117 |
| 2007/0164736 | A1 | * | 7/2007 | Joisten ................ G01R 33/05 |
| | | | | 324/253 |
| 2007/0203666 | A1 | * | 8/2007 | Watanabe ............. G01C 17/30 |
| | | | | 702/150 |
| 2007/0247141 | A1 | * | 10/2007 | Pastre ................ G01R 33/0035 |
| | | | | 324/202 |
| 2008/0048655 | A1 | * | 2/2008 | Hausperger .......... G01R 15/185 |
| | | | | 324/260 |
| 2008/0048738 | A1 | | 2/2008 | Singnurkar |
| 2008/0084720 | A1 | | 4/2008 | Thiele et al. |
| 2008/0164870 | A1 | * | 7/2008 | Beichler .............. G01D 5/2013 |
| | | | | 324/207.15 |
| 2008/0291068 | A1 | | 11/2008 | Lee |
| 2009/0096510 | A1 | | 4/2009 | Ogiwara et al. |
| 2009/0108833 | A1 | * | 4/2009 | Ziegler ................ G01R 15/185 |
| | | | | 324/117 R |
| 2009/0230955 | A1 | * | 9/2009 | Kejik .................. G01R 33/04 |
| | | | | 324/253 |
| 2010/0026392 | A1 | | 2/2010 | Wong |
| 2010/0026536 | A1 | * | 2/2010 | Yoshioka ............ H03M 1/1004 |
| | | | | 341/122 |
| 2010/0134093 | A1 | * | 6/2010 | Roellgen ............ G01R 15/207 |
| | | | | 324/117 H |
| 2010/0188072 | A1 | * | 7/2010 | Roellgen ............ G01R 15/207 |
| | | | | 324/117 H |
| 2011/0057592 | A1 | | 3/2011 | Sicard |
| 2011/0148381 | A1 | | 6/2011 | Kwan et al. |
| 2011/0227419 | A1 | | 9/2011 | Sato |
| 2011/0245708 | A1 | | 10/2011 | Finkel et al. |
| 2012/0001494 | A1 | * | 1/2012 | Urano .................. H02J 50/12 |
| | | | | 307/104 |
| 2012/0116715 | A1 | | 5/2012 | Yoshitake et al. |
| 2012/0126799 | A1 | * | 5/2012 | Schatz ................ G01R 33/04 |
| | | | | 324/234 |
| 2013/0069613 | A1 | | 3/2013 | Nakase et al. |
| 2013/0099334 | A1 | * | 4/2013 | Mohan ................ G01R 33/04 |
| | | | | 257/421 |
| 2013/0300383 | A1 | | 11/2013 | Bayer |
| 2013/0300394 | A1 | | 11/2013 | Wang et al. |
| 2013/0313993 | A1 | | 11/2013 | Wang et al. |
| 2014/0139029 | A1 | | 5/2014 | Gaspirini et al. |
| 2014/0211523 | A1 | * | 7/2014 | Mateu S Ez .......... G01R 19/04 |
| | | | | 363/44 |
| 2014/0217533 | A1 | * | 8/2014 | Pagani .............. G01R 33/0005 |
| | | | | 257/427 |
| 2014/0239946 | A1 | * | 8/2014 | Suzuki ................ G01R 15/183 |
| | | | | 324/244 |
| 2014/0285189 | A1 | * | 9/2014 | Kashmiri ............. G01R 33/04 |
| | | | | 324/253 |
| 2015/0040682 | A1 | | 2/2015 | Momose et al. |
| 2015/0295494 | A1 | * | 10/2015 | Gong .................. H05B 33/0815 |
| | | | | 315/224 |
| 2016/0047845 | A1 | * | 2/2016 | Friebe .................. H01F 21/08 |
| | | | | 324/251 |
| 2016/0161570 | A1 | * | 6/2016 | Gohara .............. G01R 33/0041 |
| | | | | 324/225 |

OTHER PUBLICATIONS

SU832502, English Machine Translation, May 15, 2015 (5 pages).

Bazzocchi et al., "Interference rejection algorithm for current measurement using magnetic sensor arrays," Sensors & Actuators 85, 2000 (pp. 38-41).

Choi et al, "The Microfluxgate Magnetic Sensor Having Closed Magnetic Path," IEEE Sensors Journal, vol. 4, No. 6, Dec. 2004 (pp. 768-771).

Dezuari et al, "Printed circuit board integrated fluxgate sensor," Sensors and Actuators 81, 2000, (pp. 200-203).

Drljaca et al, "Low-Power 2-D Fully Integrated CMOS Fluxgate Magnetometer," IEEE Sensors Journal, vol. 5, No. 5, Oct. 2005 (pp. 909-915).

Ripka et al., "Pulse Excitation of Micro-Fluxgate Sensors," IEEE Transactions on Magnetics, vol. 37, No. 4, Jul. 2001 (pp. 1998-2000).

Tang et al., "Excitation circuit for fluxgate sensor using saturable inductor," Sensors and Actuators A 113, 2004 (pp. 156-165).

Supplementary European Search Report for EP14836324.5, date of the completion of the search Jul. 14, 2017 (3 pages).

Search Report for Chinese Patent Application No. 201480042378.6, dated Dec. 25, 2017 (2 pages).

English Machine Translation for JP3399185 B2 (15 pages).

* cited by examiner

FLUXGATE MAGNETIC FIELD DETECTION METHOD AND CIRCUIT

CROSS-REFERENCE TO RELATED APPLICATIONS

This patent application claims priority from U.S. Provisional Patent Application No. 62/160,371, filed May 12, 2015, which is incorporated herein by reference in its entirety.

BACKGROUND

Magnetic sensors are used in a broad range of applications, such as measuring position, AC and DC current, or torque. Hall-effect sensors are most common in magnetic field sensing, but their offset, noise, gain variation, and nonlinearity limit the resolution and accuracy achievable in the measurement system. Fluxgate sensors offer significantly higher sensitivity, lower drift, lower noise, and high linearity and enable up to 1000-times better accuracy of the measurement. However, when fluxgate sensors are exposed to a high magnetic field, their core saturates and their output signal returns to zero. This output non-monotonicity can lead to erroneous outputs. Prior solutions for integrated fluxgates, require a separate fluxgate readout with a test signal to check for saturation.

SUMMARY OF THE INVENTION

Embodiments of the invention provide a method and circuit that can detect saturation as part of the normal fluxgate readout cycle, thus minimizing overhead and power consumption.

Prior solutions required a separate fluxgate readout, thereby adding significant power consumption and reducing signal bandwidth. In comparison, the proposed method and circuit require low overhead. Saturation is detected during the normal fluxgate readout, and uses minimal power.

Advantageously, the fluxgate method and circuit disclosed herein leverages fluxgate integration, which allows easy access to intermediate sense-coil nodes. Therefore, unlike prior art solutions, an additional fluxgate test-coil is not needed to generate a test signal. Additionally, unlike prior art solutions, a separate readout cycle is not needed to detect saturation.

The fluxgate method and circuit disclosed herein require lower power consumption. A simple low-power circuit is used for saturation detection and no power is needed for extra fluxgate excitation or generation of a test field.

A circuit for detecting magnetic fields comprises, in one embodiment, a magnetic core having an excitation winding and a sense winding, a signal generator configured to provide excitation signals to the excitation winding, a detection circuit configured to detect signals on the sense winding and to provide an output signal that indicates whether an external magnetic field is affecting the magnetic core, wherein the presence of the external magnetic field is detected when excitation winding signals are being generated but no sense winding signals are present.

The magnetic core may be part of a two-core fluxgate sensor, wherein the excitation winding is wrapped around both cores and the sense winding is wrapped around a portion of a single core. The two cores of the fluxgate sensor may be separate components or may be joined together at one or both ends to form a "U" shape, ring, or oval. The magnetic core may be part of a ring-core fluxgate sensor, wherein the excitation winding is wrapped around substantially all of the ring cores and the sense winding is wrapped around a portion of the ring core.

The detection circuit is configured to demodulate the signals on the sense winding to a sense signal, integrate the sense signal to a final value, and compare the final value to a fixed reference value. The excitation signals may comprise current pulses, and the detection circuit may synchronize the signals on the sense winding to the current pulses.

The detection circuit may further comprise a voltage-to-current converter having an input coupled to the sense coil, a demodulator switch receiving an output from the voltage-to-current converter and generating current signal, a capacitor coupled to the output of the demodulator switch, and a comparator coupled to the capacitor and to a reference voltage, the comparator outputting a signal indicating detection of voltage pulses on the core rod.

A fluxgate sensor, in one example, comprises a fluxgate having a first core section and a second core section, a sense coil having a first winding around the first core section, and a detection circuit coupled to the first winding and configured to detect signals on the first winding and to provide an output signal that indicates whether the fluxgate is being effected by an external magnetic field. The sensor may further comprise a signal generator configured to provide excitation signals to an excitation winding on the fluxgate. The presence of an external magnetic field is indicated when excitation signals are generated on the fluxgate and no corresponding first winding signals are detected by the detection circuit.

The first core section and the second core section may be segments of a single magnetic core. The first core section and the second core section may be separate magnetic cores in a two-core fluxgate sensor. The two cores of the fluxgate sensor are joined together at one or both ends. The first core section and the second core section may be segments of a ring-core fluxgate sensor.

The detection circuit may be configured to demodulate the signals on the first winding to a sense signal, integrate the sense signal to a final value, and compare the final value to a fixed reference value.

A method for detecting saturation in a fluxgate sensor comprises demodulating signals detected on a sense winding of a magnetic core to a sense signal, integrating the sense signal to a final value, and comparing the final value to a fixed reference value. The method may further comprise providing an output signal that indicates whether the magnetic core is saturated, wherein saturation is detected when excitation signals are applied to the magnetic core but no significant sense winding signals are present.

The excitation signals may comprise current pulses applied by a signal generator to an excitation coil on the magnetic core, and the sense signal may be synchronized to the current pulses. The magnetic core used in the method may be part of a two-core fluxgate sensor. The magnetic core used in the method may be part of a ring-core fluxgate sensor.

BRIEF DESCRIPTION OF THE DRAWINGS

Figure 1:
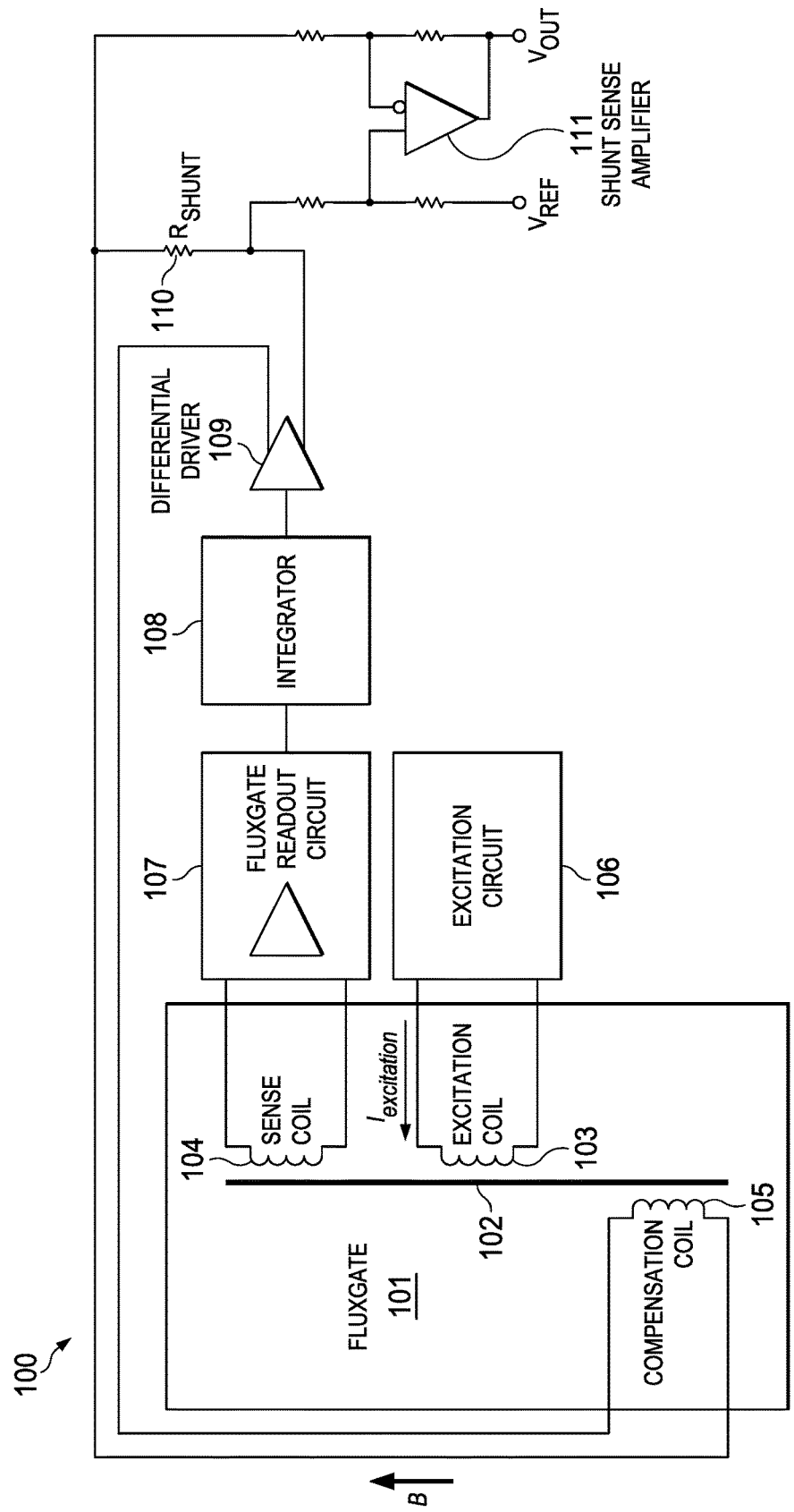

Having thus described the invention in general terms, reference will now be made to the accompanying drawings, wherein:

FIG. 1 is a simplified block diagram of a fluxgate magnetic-field sensor circuit.

Figure 2:
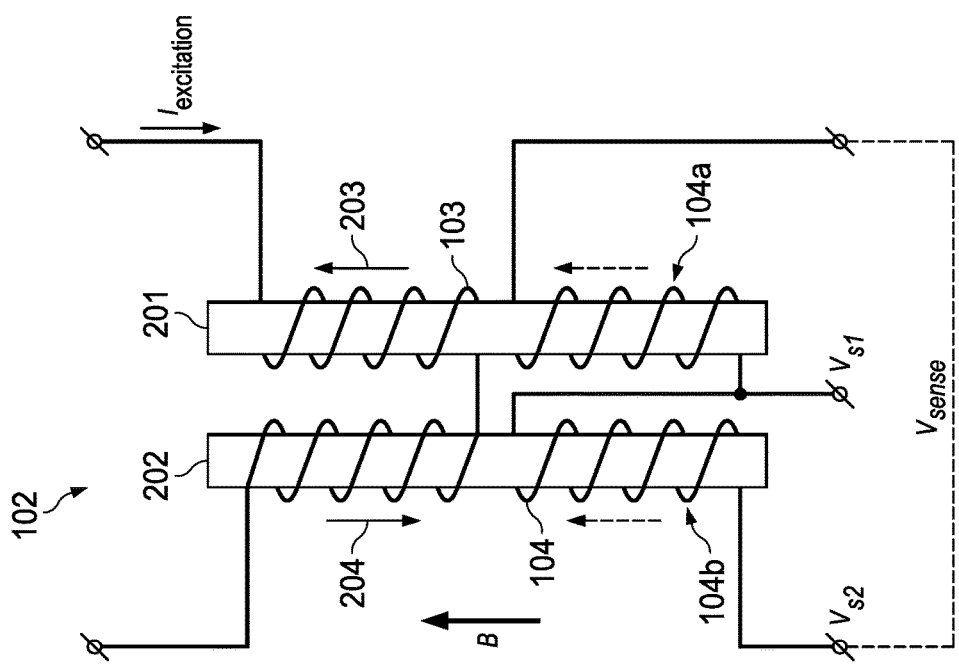

FIG. 2 is a block diagram illustrating twin ferromagnetic rod cores and coil windings in a fluxgate sensor.

Figure 3:
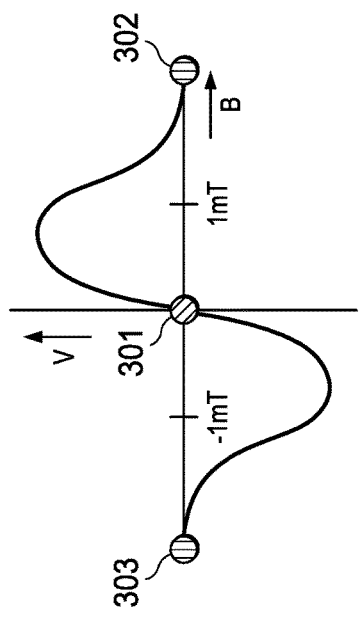

FIG. 3 is a graph illustrating the effect on the output of a fluxgate resulting from changes in applied external magnetic field.

Figure 4:
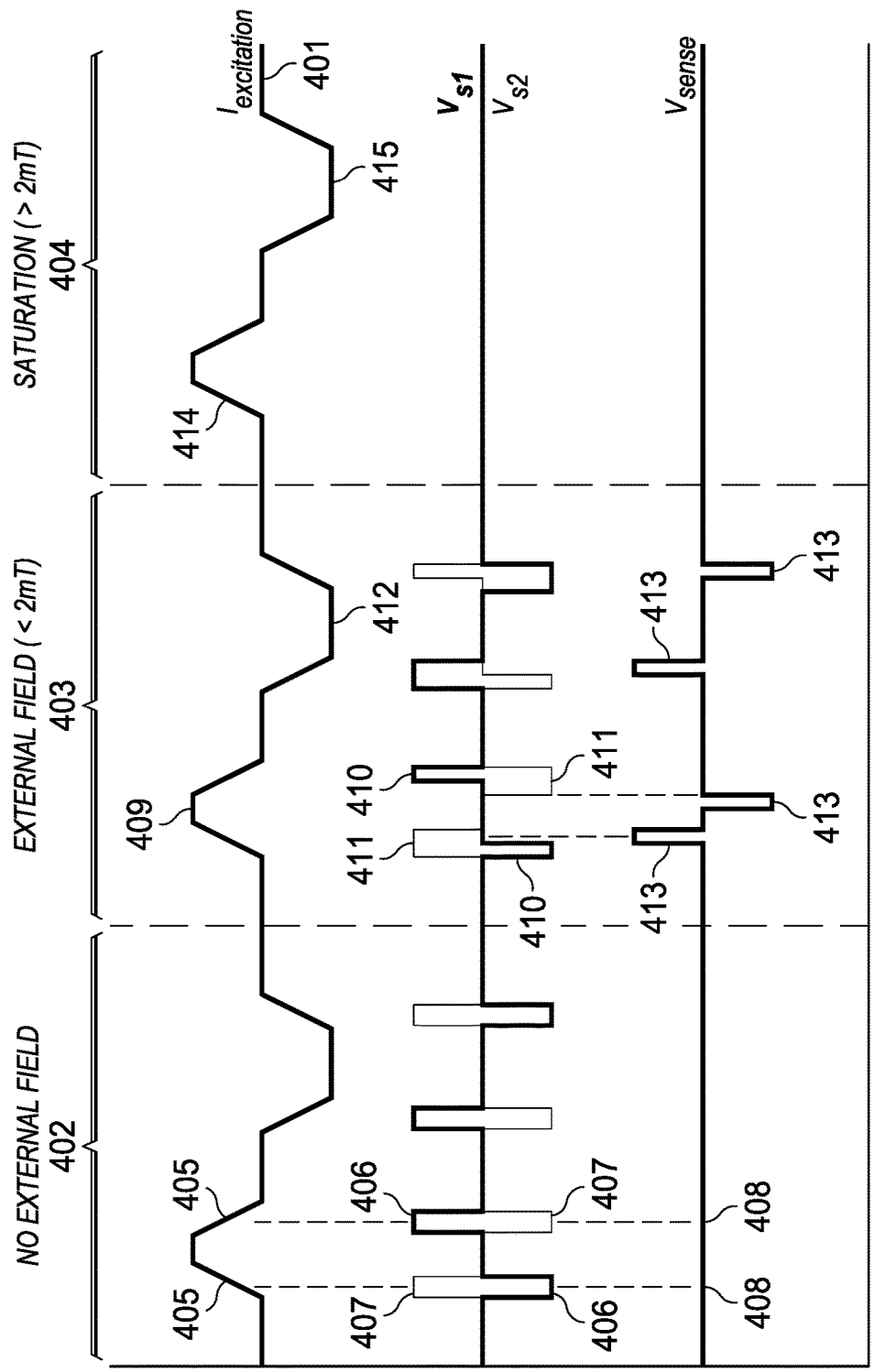

FIG. 4 is a graph illustrating the effects of an excitation current on a fluxgate in the presence of various external field strengths.

Figure 5:
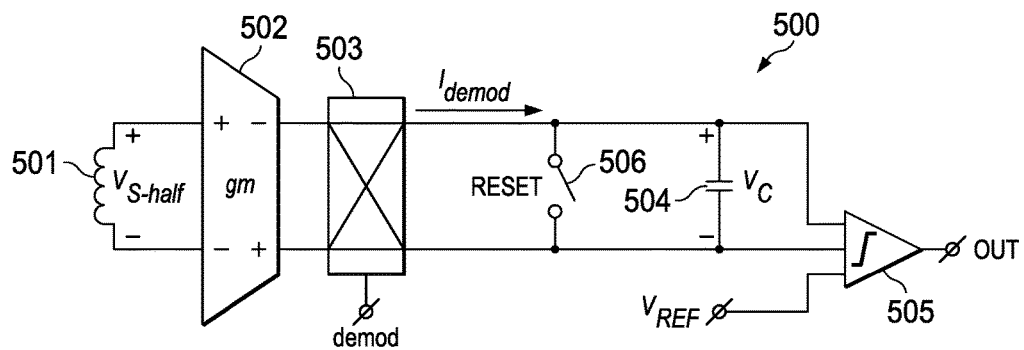

FIG. 5 is a block diagram of an example detection circuit for use in a fluxgate sensor.

Figure 6:
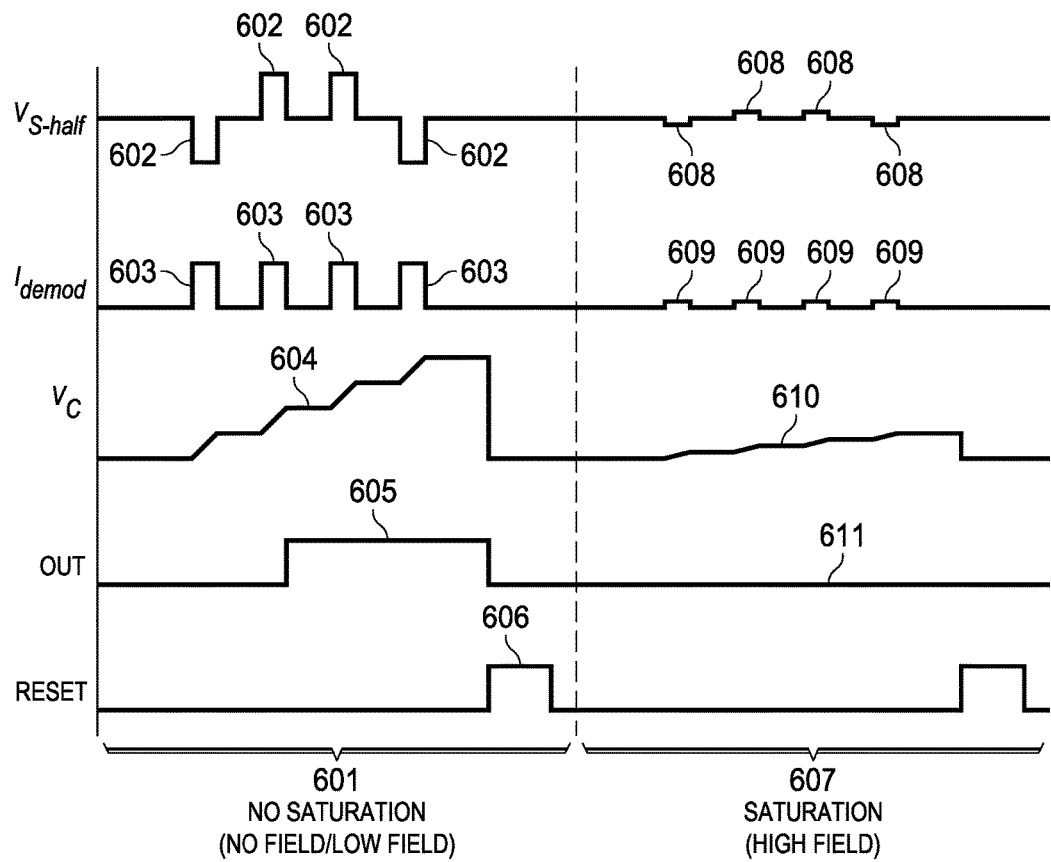

FIG. 6 is a graph illustrating the operation of a detection circuit under varying saturation conditions.

Figure 7:
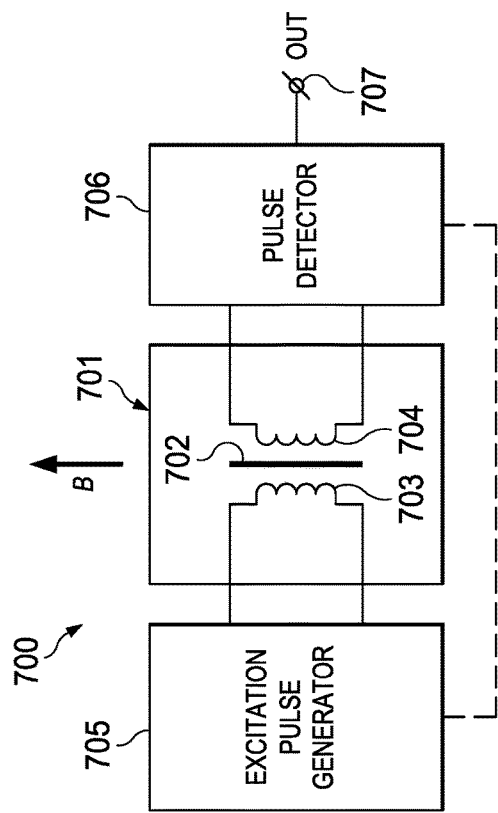

FIG. 7 is a simplified block diagram of a magnetic switch.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

Fluxgate sensors may be used, for example, in navigation and compass applications as well as for metal detection. Generally, fluxgate designs fall into two broad styles that employ either rod cores or ring cores. The fluxgate circuits illustrated herein use a rod-core design, but it will be understood that ring-core and other fluxgate configurations may also apply the principles disclosed. Fluxgates use a highly permeable core that concentrates the magnetic field being measured. The core is magnetically saturated in alternating and opposing directions. This saturation may be driven by means of an excitation coil that in turn is driven by a sine or square waveform. In one embodiment, the excitation coil is driven by a pulsed waveform in which the current always returns to zero before an opposite polarity pulse is generated.

FIG. 1 is a simplified block diagram of a fluxgate magnetic-field sensor circuit 100. Fluxgate 101 has a core 102 that is coupled to excitation coil 103, sense coil 104, and compensation coil 105. As illustrated in FIG. 2, core 102 may comprise twin ferromagnetic rod cores 201, 202 having coil windings, such as excitation coil 103 and sense coil 104, that are wrapped around the core rods. As shown in FIG. 2, the excitation coil 103 is wound in opposite directions on each core rod 201, 202, while the sense coil 104 is wound in the same direction on both core rods 201, 202.

Core 102 is set up to measure a magnetic field in the direction of B. Excitation circuit 106 generates an excitation current ($I_{excitation}$) through excitation coil 103. As the excitation current flows through the windings of excitation coil 103, one core rod 201 will have a field 203 in the same direction as B and the other core rod 202 will have a field 204 in the opposite direction of B. In the absence of an external field (i.e., when B=0), the two core rods 201, 202 go into and come out of saturation at the same time due to the excitation current. Thus, the fields 203, 204 generated in cores 201, 202 exactly cancel out and there is no net change of flux across the core 102. Since there is no change in flux across sense coil 104, no voltage ($V_{sense}$) is induced.

On the other hand, when an external field B is present (i.e., when |B|>0), the flux induced across core rods 201, 202 will not cancel out. Instead, core 201, which is generating field 203 in the direction of the external field, will go into saturation sooner (i.e., field 203 adds to B). Meanwhile, core 202, which is generating field 204 opposite the external field, goes into saturation later (i.e., field 204 subtracts from B). Because of this effect, the flux generated by the excitation current across core rods 201, 202 does not exactly cancel out. This results in a net change in flux across sense coil 104 with each pulse of the excitation current. According to Faraday's law, this net change in flux induces a voltage ($V_{sense}$) across sense coil 104.

This voltage ($V_{sense}$) is detected by fluxgate readout circuit 107, which in turn applies a proportional DC voltage to integrator 108. The integrator output connects to a differential driver 109 that outputs a compensation current through compensation coil 105. The compensation coil 105 generates an opposing magnetic field (−B) that brings the overall magnetic field at sense coil 104 back to zero.

The compensation current output from differential driver 109 is proportional to the external magnetic field (B) and generates a voltage drop across shunt resistor ($R_{SHUNT}$) 110. An integrated difference amplifier 111 may be coupled across shunt resistor 110 to generate an output voltage ($V_{OUT}$) that is referenced to $V_{REF}$ and is proportional to the magnetic field.

The open-loop output (Vsense) of fluxgate 102 is non-linear and non-monotonous. By adding the feedback loop with compensation coil 105, fluxgate sensor circuit 100 provides a more linear output.

FIG. 3 is a graph illustrating the effect on the output (Vsense) of fluxgate 102 resulting from changes in applied external magnetic field B. In normal operation, the fluxgate output (Vsense) is driven to zero 301. However, a problem arises if fluxgate 102 is overloaded due to a large external magnetic field input. If this occurs, the fluxgate output (Vsense) may also be driven to zero (e.g., points 302 (large B) or 303 (large −B)). In the presence of large external magnetic fields, the analog feedback loop can be driven in the wrong direction due to offsets and lock-up. Accordingly, a method and circuit are required to detect this saturation condition in a fluxgate sensor.

FIG. 4 is a graph illustrating the effects of the excitation current ($I_{excitation}$) 401 on the fluxgate in the presence of no external field 402, a relatively small external field (e.g., less than 2 mT) 403, and a relatively large external field (e.g., more than 2 mT) 404. It will be understood that FIG. 4 and the related description below provide a simplified explanation of the fluxgate operation. The excitation current ($I_{excitation}$) 401 is a series of alternating pulses. As each pulse ramps up or down (405), a voltage ($V_{S1}$ or $V_{S2}$) is generated across a portion (e.g., one-half or some other sub-section) of the sense coil 104. Due to the opposed winding of excitation coil 103 and the same winding of sense coil 104, the polarity of the voltages across each half of the sense coil 104 (i.e., the voltage generated on each rod—$V_{S1}$ 406, $V_{S2}$ 407) are opposite each other. When no external field is present (i.e., B=0 (402)), the net effect of the excitation current ($I_{excitation}$) 401 pulses is that the sense-coil voltages ($V_{S1}$ 406, $V_{S2}$ 407) cancel each other out. Therefore, the output (Vs) of the sense coil 104 is zero (408). The same effect happens for both positive and negative excitation current ($I_{excitation}$) 401 pulses when on externa field (B) is present.

When an external field (B) is present (403), the flux generated by the excitation current ($I_{excitation}$) 401 across each half of sense coil 104 does not cancel out. On positive pulses 409, sense-coil portion 104A saturates faster than sense-coil portion 104B. As a result, voltage pulses $V_{S1}$ 410 across sense-coil portion 104A are shorter than voltage pulses $V_{S2}$ 411 across sense-coil portion 104B. The opposite effect occurs for negative pulses 412. Due to the difference in pulse length, the sense-coil voltages ($V_{S1}$ 410, $V_{S2}$ 411) do not cancel each other out. Therefore, in the presence of an external field (B) the output (Vs) of the sense coil 104 comprises a series of pulses 413 that are caused by the external field (B). As noted above, these pulses can be captured in fluxgate readout circuit 107 and integrated in integrator 108 to create an input to differential driver 109, which drives the compensation coil 105 to counteract the external field (B). However, when an external field (B) is large (404), the flux generated by the excitation current 401 across each half of sense coil 104 gets overwhelmed by the flux generated by the external field. As a result, it is difficult to detect any difference between the fluxes on each half of sense coil 104, which may cause a false negative indication that an external magnetic field is present. Because core 102 is already saturated, on positive pulses 414 or negative pulses 415 of the excitation current 401, sense-coil portions 104A and 104B, respectively, do not generate any voltage pulses $V_{S1}$ or $V_{S2}$.

Similar to the situation where no external field is present (i.e., B=0 (402)), when a large external field is present (404) and the fluxgate sensor is saturated, there is no output ($V_S$) of the sense coil 104. However, unlike the situation where no external field is present, the lack of the sense coil output is not due to voltage pulses $V_{S1}$ or $V_{S2}$ cancelling each other out. Instead, as illustrated in FIG. 4, due to saturation by the external field, voltage pulses $V_{S1}$ or $V_{S2}$ are not generated by the excitation current because the core rods 201, 202 are already saturated. Therefore, the excitation current has no or very little measureable effect on core 102. As a result, in the presence of a large external field, the output of sense coil 104 may incorrectly indicate that no field is present. In order to address this problem, the voltage across one or both of the sense coil halves can be monitored to indicate how the sense coil output voltage should be interpreted.

FIG. 5 is a block diagram of an example detection circuit 500 for use in a fluxgate sensor. Coil 501 detects magnetic flux generated across one of the twin rod cores and generates voltage $V_{S-half}$. Coil 501 corresponds to a portion (e.g., 104A or 104B) of the sense coil 104 wrapped around either of the twin rod cores. In an alternative embodiment, coil 501 may be a coil that is separate from sense coil 104. Voltage $V_{S-half}$ from half sense coil 501 is input to voltage-to-current converter 502. The output of converter 502 is demodulated in chopper switch 503 to generate a demodulated current ($I_{demod}$), which charges a capacitor 504 to a voltage $V_C$. The voltage across capacitor 504 is input to comparator 505, which generates an output signal (out) referenced to a reference voltage ($V_{ref}$). Reset switch 506 is closed to reset the voltage $V_C$ across capacitor 504 to zero.

FIG. 6 is a graph illustrating the operation of detection circuit 500 under saturation and no saturation conditions. When no saturation is present in the core rods (601) (i.e., when B=0 or B is not greater than a saturation threshold), the excitation current applied to the excitation coil causes $V_{S-half}$ pulses 602 to be detected across half sense coil 501. These pulses alternate polarity as the rod core is driven into and out of saturation by the excitation current applied to excitation coil. Voltage-to-current converter 502 receives the $V_{S-half}$ pulses 602 and converts them to a AC current that is input to chopper switch 503, which in turn outputs the demodulated current ($I_{demod}$) signal having pulses 603 that correspond to $V_{S-half}$ pulses 602.

The demodulated current ($I_{demod}$) pulses 603 charge capacitor 504 to a voltage $V_C$ that is input to comparator 505. The output signal (out) from comparator 505 is set to a high or low value based upon reference voltage ($V_{ref}$). Reset switch 506 is closed to reset the voltage $V_C$ across capacitor 504 to zero. As illustrated in FIG. 6, after a number of $V_{S-half}$ pulses 602 are detected across half sense coil 501, the voltage $V_C$ 604 rises above the reference voltage and the output (out) 605 of the detection circuit is set high. This high signal indicates that voltage pulses with a sufficient magnitude were detected across the half sense coil. This also indicates that the overall output $V_S$ of the sense coil can be used to measure the external field detected by the fluxgate sensor. This is because the $V_{S-half}$ pulses 602 across half sense coil 501 are generated by the excitation current.

When an external field drives the rod cores into saturation (607) (i.e., when B is greater than a saturation threshold), the excitation current applied to the excitation coil generates relatively small causes $V_{S-half}$ pulses 608 on half sense coil 501. These pulses 608 may be undetectable if the external field is very large. The corresponding demodulated current ($I_{demod}$) signal pulses are also relatively small. This prevents the voltage 610 of capacitor 504 from reaching a sufficient level to trigger the output signal. As a result, the output 611 of the detection circuit stays low, which indicates to the fluxgate circuit that the output $V_S$ of the sense coil is not usable to measure the external field detected by the fluxgate sensor.

Referring again to FIG. 2, it will be understood that while the example used in the description above uses two magnetic core rods, the basic fluxgate operation would not change if rods 201, 202 were connected at either or both ends to create a single core (e.g., having a "U", racetrack, oval, or ring shape).

FIG. 7 is a simplified block diagram of a magnetic switch 700. Fluxgate Sensor 701 has a single magnetic core 702 wrapped by two coils 703, 704. Coil 703 is an excitation coil that is driven by a signal generated by excitation pulse generator 705. Coil 704 is a sense coil. Pulse detector 706 detects the presences of pulses on sense coil 704. In one embodiment, detection circuit 500 (FIG. 5) may be used as pulse detector 706.

In the presence of zero or low magnetic field B, coils 703, 704 are strongly inductively coupled due to high core 702 permeability. Therefore, current pulses generated on coil 703 by pulse generator 705 will be detected on coil 704 and may be output by pulse detector 706.

If the magnetic field B is high on the other hand, the inductive coupling between coils 703, 704 decreases. As a result of this weak coupling, pulses on coil 703 will not be detected on coil 704. Therefore, in the presence of a high field, there will be no output at pulse detector 706 as a result of pulses on coil 703. It will be understood that sensor 701 does not have to go into saturation for the magnetic switch 700 to detect the presence of external fields. For example, the signals from excitation pulse generator 705 do not need to drive magnetic core 702 into saturation, which may be useful to reduce power consumption.

Magnetic switch 700 would not measure magnetic field B quantitatively, but could function as a simple magnetic switch with a binary output 707 that indicates whether a large magnetic field has been detected or not. For example, excitation pulse generator 705 may continuously drive excitation coil 703 with an excitation signal. In the presence of low or no magnetic field B, sense coil 704 will couple to excitation coil 703 and pulse detector 706 will detect these pulses. On the other hand, when a high magnetic field B is present, sense coil 704 will not couple to excitation coil 703 and pulse detector 706 will not detect the pulses on coil 703. Accordingly, assuming that pulse generator 705 is continuously driving coil 703, as soon as pulse detector 706 determines that it does not sense pulses on coil 704, a signal can be output indicating that a high magnetic field is present.

The pulse detector 706 may operate to demodulate sensed voltage pulses from sense coil 704 to a sense signal to which the detector can synchronize (e.g., synchronized to the signal from excitation pulse generator 705). In one embodiment, for example, the sense signal is a digital timing signal, such as a pulsed unipolar signal (e.g., changing over time between 0V and 5V). The pulse detector 706 then integrates the demodulated voltage pulses to a final value and compares the final value to a fixed reference value. An output signal 707 is provided based upon the comparison. As a matter of design choice, the output signal 707 may be set to a high or a low value that indicates when a magnetic field is detected (i.e., when no pulses are detected on the sense coil 704). Pulse detector 706 may have a connection 708 that allows pulse generator 705 to indicate when excitation pulses are being provided to excitation coil 703, which allows pulse detector 706 to synchronize its signal detection to the excitation pulses of interest.

In practice, saturation of the core is not an on/off state, but is a gradual phenomenon. In order to simplify the description herein, the saturation of a magnetic core is treated as occurring abruptly at a certain flux density. In reality, however, this saturation is a gradual process. For smaller magnetic fields, the core behaves in a slightly non-linear manner, and this non-linearity increases with field until the core is fully saturated. In the embodiment illustrated in FIGS. 1 and 2, monitoring of signals on a sense-coil portion (104a or 104b) allows for detection of a saturating field that may otherwise cause a false output across the entire sense coil. In the magnetic switch embodiment illustrated in FIG. 7, the circuit is not primarily intended to detect saturation, but instead is useful in detect a certain field level. This can be accomplished without fully saturating the magnetic core 702 and just using the non-linear behavior at lower flux levels.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. A fluxgate sensor circuit comprising:
a magnetic core having an excitation winding and a sense winding, the sense winding having portions;
an excitation circuit having outputs coupled to the excitation winding; and
a saturation detection circuit including:
a voltage to current converter having inputs coupled to one of the portions of the sense winding and having converter outputs;
a reset switch coupled across the converter outputs;
a capacitor coupled across the converter outputs; and
a comparator having inputs coupled to the converter outputs and to the capacitor, having a reference voltage input, and having an output.

2. The circuit of claim 1, in which the magnetic core has two cores, and in which the excitation winding is wrapped around both cores and the sense winding is wrapped around a portion of a single core.

3. The circuit of claim 2, in which the two cores are joined together at one or both ends.

4. The circuit of claim 1, in which the magnetic core is a ring-core, and in which the excitation winding is wrapped around substantially all of the ring core and the sense winding is wrapped around a portion of the ring core.

5. A fluxgate sensor device, comprising:
a fluxgate sensor having a first core section and a second core section;
a sense winding having portions, with one portion around the first core section and another portion around the second core section;
an excitation winding around the fluxgate sensor;
a detection circuit coupled to one of the portions of the sense and including:
a voltage to current converter having inputs coupled to the portion of the sense winding coupled to the detection circuit and having converter outputs;
a reset switch coupled across the converter outputs;
a capacitor coupled across the converter outputs; and
a comparator having inputs coupled to the converter outputs and to the capacitor, having a reference voltage input, and having an output.

6. The sensor of claim 5, in which the first core section and the second core section are segments of a single magnetic core.

7. The sensor of claim 5, in which the first core section and the second core section are separate magnetic cores in a two-core fluxgate sensor.

8. The sensor of claim 7, in which the two cores of the fluxgate sensor are joined together at one or both ends.

9. The sensor of claim 5, in which the first core section and the second core section are segments of a ring-core fluxgate sensor.

10. A method for detecting saturation in a fluxgate sensor, comprising:
providing alternating excitation signals to an excitation winding on a magnetic core, including providing excitation signals in opposite directions on the excitation winding that do not saturate the core;
sensing the excitation signals from a sensing winding having portions wound in the same direction on the magnetic core with a sensing circuit;
detecting a signal on one of the portions of the sensing winding;
demodulating the detected signal to generate a current signal;
integrating the current signal to generate a final value signal; and
comparing the final value signal to a reference signal to generate an output signal.

11. The method of claim 10, including generating the output signal to indicate whether the magnetic core is saturated.

12. The method of claim 11, in which the excitation signals includes current pulses applied by a signal generator to the excitation winding on the magnetic core, and the sense signal is synchronized to the current pulses.

13. The method of claim 10, in which the magnetic core is part of a two-core fluxgate sensor.

14. The method of claim 10, in which the magnetic core is part of a ring-core fluxgate sensor.

15. The method of claim 10, in which the output signal is generated to indicate whether the magnetic core is saturated in response to an external magnetic field affecting the magnetic core.

* * * * *